(12) United States Patent
Chen et al.

(10) Patent No.: US 12,176,344 B2
(45) Date of Patent: Dec. 24, 2024

(54) METHODS OF FORMING SEMICONDUCTOR STRUCTURE

(71) Applicant: Taiwan Semiconductor Manufacturing Company, Ltd., Hsinchu (TW)

(72) Inventors: Hsien-Wei Chen, Hsinchu (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 638 days.

(21) Appl. No.: 17/465,867

(22) Filed: Sep. 3, 2021

(65) Prior Publication Data
US 2021/0398973 A1   Dec. 23, 2021

Related U.S. Application Data

(62) Division of application No. 16/035,702, filed on Jul. 15, 2018, now Pat. No. 11,114,433.

(51) Int. Cl.
| | |
|---|---|
| *H01L 27/06* | (2006.01) |
| *H01L 21/768* | (2006.01) |
| *H01L 23/00* | (2006.01) |
| *H01L 23/522* | (2006.01) |

(52) U.S. Cl.
CPC .... *H01L 27/0688* (2013.01); *H01L 21/76816* (2013.01); *H01L 21/76877* (2013.01); *H01L 23/5226* (2013.01); *H01L 24/09* (2013.01); *H01L 24/33* (2013.01); *H01L 2224/02371* (2013.01); *H01L 2224/02372* (2013.01); *H01L 2224/02379* (2013.01)

(58) Field of Classification Search
CPC ......... H01L 24/05; H01L 24/09; H01L 24/33; H01L 21/76898; H01L 21/76816; H01L 21/76877; H01L 23/528; H01L 23/5226
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |

(Continued)

*Primary Examiner* — Jaehwan Oh
*Assistant Examiner* — John M Parker
(74) *Attorney, Agent, or Firm* — JCIPRNET

(57) ABSTRACT

A method of forming a semiconductor structure includes: forming an interconnect structure over a substrate; forming a pad over the interconnect structure, wherein the pad is electrically connected to the interconnect structure; forming a bonding dielectric layer over the interconnect structure; and forming a bonding metal layer in the bonding dielectric layer to electrically connect to the interconnect structure, wherein the bonding metal layer includes a via plug and a metal feature formed over the via plug, a height of the metal feature is greater than or equal to a height of the via plug.

20 Claims, 18 Drawing Sheets

(56) References Cited

U.S. PATENT DOCUMENTS

| | | | |
|---|---|---|---|
| 9,799,587 B2* | 10/2017 | Fujii | H01L 23/498 |
| 10,692,826 B2* | 6/2020 | Wei | H01L 24/05 |
| 2002/0109232 A1* | 8/2002 | Lin | H01L 23/60 |
| | | | 257/E21.582 |
| 2002/0115282 A1* | 8/2002 | Lin | H01L 21/76838 |
| | | | 257/E21.022 |
| 2002/0171117 A1* | 11/2002 | Solo De Zaldivar | H01L 24/13 |
| | | | 257/E23.021 |
| 2008/0237866 A1* | 10/2008 | Wang | H01L 23/3192 |
| | | | 257/E23.141 |
| 2011/0042814 A1* | 2/2011 | Okuyama | H01L 23/53238 |
| | | | 438/455 |
| 2012/0292784 A1* | 11/2012 | Nishio | H01L 23/26 |
| | | | 257/E23.145 |
| 2014/0061940 A1* | 3/2014 | Kitao | H01L 21/76898 |
| | | | 438/653 |
| 2018/0240859 A1* | 8/2018 | Yang | H01L 24/05 |

* cited by examiner

METHODS OF FORMING SEMICONDUCTOR STRUCTURE

CROSS-REFERENCE TO RELATED APPLICATION

This is a divisional application of and claims the priority benefit of U.S. application Ser. No. 16/035,702, filed on Jul. 15, 2018, now allowed. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. Such improvement in integration density is mostly attributed to successive reductions in minimum feature sizes, which allows more components to be integrated into a given area.

These smaller electronic components also require smaller packages that occupy less area than previous packages. Some types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. Some 3DICs are prepared by placing chips over chips on a semiconductor wafer level. 3DICs provide improved integration density and other advantages, such as faster speeds and higher bandwidth, because of the decreased length of interconnects between the stacked chips. However, there are quite a few challenges to be handled for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
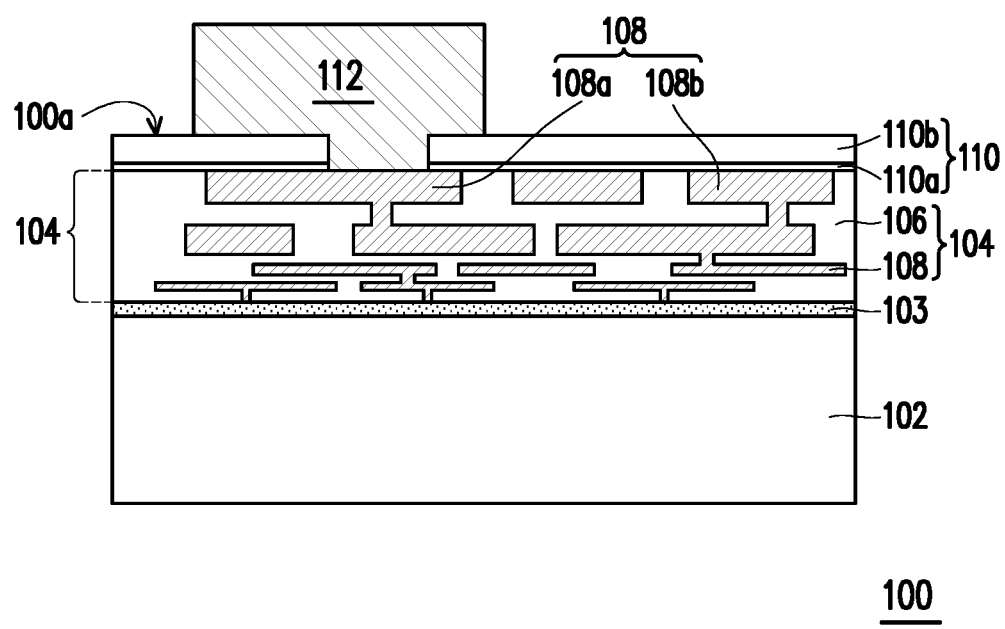
FIG. 1A to FIG. 1I are cross-sectional views of a method of forming a three-dimensional integrated circuit (3DIC) structure in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1I are cross-sectional views of a method of forming a three-dimensional integrated circuit (3DIC) structure in accordance with a first embodiment.

Referring to FIG. 1A, a first die 100 is provided. The first die 100 includes a first semiconductor substrate 102, a first device layer 103, a first interconnect structure 104, and a first passivation layer 110. In some embodiments, the first die 100 may be an application-specific integrated circuit (ASIC) chip, an analog chip, a sensor chip, a wireless and radio frequency chip, a voltage regulator chip or a memory chips, for example.

In some embodiments, the semiconductor substrate 102 may include silicon or other semiconductor materials. Alternatively, or additionally, the first semiconductor substrate 102 may include other elementary semiconductor materials such as germanium. In some embodiments, the first semiconductor substrate 102 is made of a compound semiconductor such as silicon carbide, gallium arsenic, indium arsenide or indium phosphide. In some embodiments, the first semiconductor substrate 102 is made of an alloy semiconductor such as silicon germanium, silicon germanium carbide, gallium arsenic phosphide, or gallium indium phosphide. In some embodiments, the first semiconductor substrate 102 includes an epitaxial layer. For example, the first semiconductor substrate 102 has an epitaxial layer overlying a bulk semiconductor.

In some embodiments, the first device layer 103 is formed over the first semiconductor substrate 102 in a front-end-of-line (FEOL) process. The first device layer 103 includes a wide variety of devices. In some embodiments, the devices comprise active components, passive components, or a combination thereof. In some embodiments, the devices may include integrated circuits devices. The devices are, for example, transistors, capacitors, resistors, diodes, photodiodes, fuse devices, or other similar devices. In some embodiments, the first device layer 103 includes a gate structure, source and drain regions, and isolation structures, such as shallow opening isolation (STI) structures (not shown). In the first device layer 103, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the first semiconductor substrate 102. The functions of the devices may include memory, processors, sensors, amplifiers, power distribution, input and/or output circuitry, or the like.

Referring to FIG. 1A, the first interconnect structure 104 is formed over the first device layer 103. In detail, the first interconnect structure 104 includes a first insulating material 106 and a plurality of first metal features 108. The first metal features 108 are formed in the first insulating material 106 and electrically connected to the first device layer 103. A portion of the first metal features 108, such as top metal features 108a and 108b, is exposed by the first insulating material 106. In some embodiments, the first insulating material 106 includes an inner-layer dielectric (ILD) layer on the first device layer 103, and at least one inter-metal dielectric (IMD) layer over the ILD layer. In some embodiments, the first insulating material 106 includes silicon oxide, silicon oxynitride, silicon nitride, low dielectric constant (low-k) materials or a combination thereof. In some alternatively embodiments, the first insulating material 106 may be a single layer or multiple layers. In some embodiments, the first metal features 108 include plugs and metal lines. The plugs may include contacts formed in the ILD layer, and vias formed in the IMD layer. The contacts are formed between and in connect with the first device layer 103 and a bottom metal line. The vias are formed between and in connect with two metal lines. The first metal features 108 may be made of tungsten (W), copper (Cu), copper alloys, aluminum (Al), aluminum alloys, or a combination thereof. In some alternatively embodiments, a barrier layer (not shown) may be formed between the first metal features 108 and the first insulating material 106 to prevent the material of the first metal features 108 from migrating to or diffusion to the first device layer 103. A material of the barrier layer includes tantalum, tantalum nitride, titanium, titanium nitride, cobalt-tungsten (CoW) or a combination thereof, for example.

Referring to FIG. 1A, the first passivation layer 110 is formed over the first interconnect structure 104. The first passivation layer 110 covers the first insulating material 106 and the top metal features 108b. Further, a portion of the top metal features 108a is covered by the first passivation layer 110, and another portion of the top metal features 108a is exposed by the first passivation layer 110, so that the another portion of the top metal features 108a may be electrically connected to the to-be-formed first pad 112. In some embodiments, the first passivation layer 110 includes silicon oxide, silicon nitride, benzocyclobutene (BCB) polymer, polyimide (PI), polybenzoxazole (PBO) or a combination thereof and is formed by a suitable process such as spin coating, CVD or the like. In an embodiment, the first passivation layer 110 may be a single layer structure, a bilayer structure, or a multilayer structure. As shown in FIG. 1A, the first passivation layer 110 includes a passivation material 110a and a passivation material 110b formed over the passivation material 110b. The passivation materials 110a and 110b have different materials. For example, the passivation material 110a may include silicon nitride, while the passivation material 110b may include polyimide (PI) or any material different from silicon nitride.

Referring to FIG. 1A, the first pad 112 is formed over the first passivation layer 110 and extends to contact the top metal features 108a. A material of the first pad 112 is different from the material of the first metal features 108. In some embodiments, the material of the first pad 112 is softer than the material of the first metal features 108. In some embodiments, the first pad 112 includes a metal material, such as aluminum, copper, nickel, gold, silver, tungsten, or a combination thereof. The first pad 112 may be formed by depositing a metal material layer through a suitable process such as electro-chemical plating process, CVD, atomic layer deposition (ALD), PVD or the like, and then patterning the metal material layer.

In some embodiments, the pad 112 may be a test pad and the first die 100 may be a known good die (KGD). That is, a die performance test is conducted to the first pad 112 of the first die 100 to identify or select known good die. In some embodiments, the die performance test is conducted by using a die performance probe (not shown) inserted into the first pad 112.

Figure 1B:
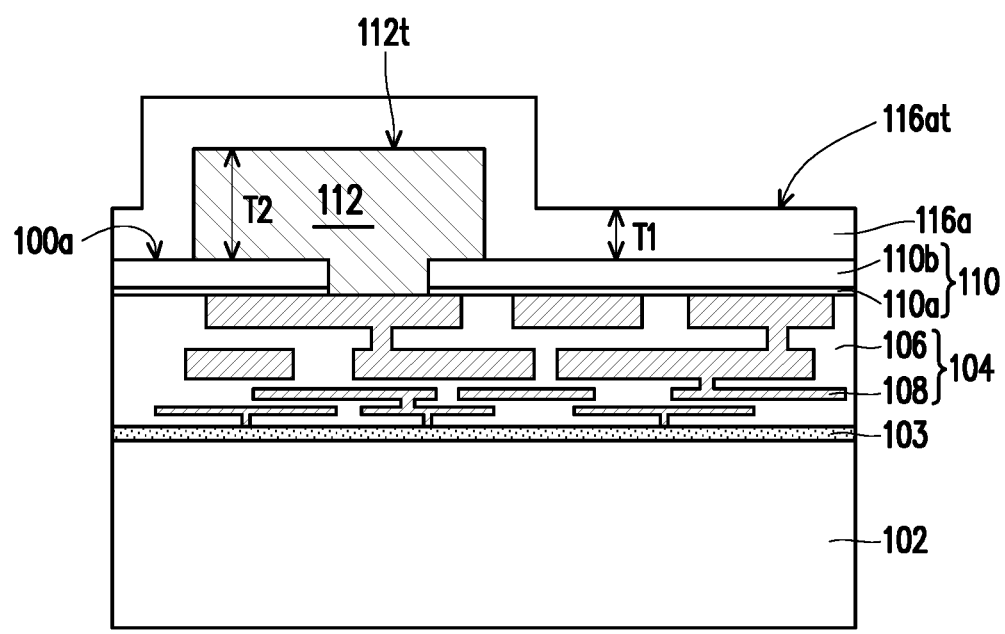

Referring to FIG. 1B to FIG. 1H, a first bonding structure 115 is formed over a front side 100a of the first die 100. In detail, as shown in FIG. 1B, after the first die 100 is identified as the known good die, a bonding dielectric material 116a (or referred as a first bonding dielectric material) is disposed over the front side 100a of the first die 100. In some embodiments, the bonding dielectric material 116a is a conformal layer. Specifically, as shown in FIG. 1B, the bonding dielectric material 116a conformally covers the first pad 112 and the first passivation layer 110. In some embodiments, the bonding dielectric material 116a includes silicon oxide, silicon nitride, polymer or a combination thereof. The bonding dielectric material 116a is formed by a suitable process such as spin coating, CVD or the like. Herein, when a layer described as "conformally cover", the layer is formed with an uniform thickness and extends along the surface topography of the underlying layer or structure. For example, as shown in FIG. 1B, the bonding dielectric material 116a extends along top surfaces of the first pad 112 and the first passivation layer 110, so that a top surface 116at of the bonding dielectric material 116a has an uneven surface or an undulated surface. In some embodiments, a thickness T1 of the bonding dielectric material 116a is 1.0 µm to 3.0 µm. In some alternative embodiments, the thickness T1 of the bonding dielectric material 116a is less than a thickness T2 of the first pad 112. Herein, the thickness T1 of the bonding dielectric material 116a is referred as a distance between the top surface of the first passivation layer 110 which is not covered by the first pad 112 and the top surface 116at of the bonding dielectric material 116a, while the thickness T2 of the first pad 112 is referred as a distance between the top surface of the first passivation layer 110 and the top surface 112t of the first pad 112. In the case, a top surface 112t of the first pad 112 is higher than the top surface 116at of the bonding dielectric material 116a not covering the first pad 112. Specifically, the top surface 112t of the first pad 112 is higher than the top surface 116at of the bonding dielectric material 116a on the first passivation layer 110.

Figure 1C:
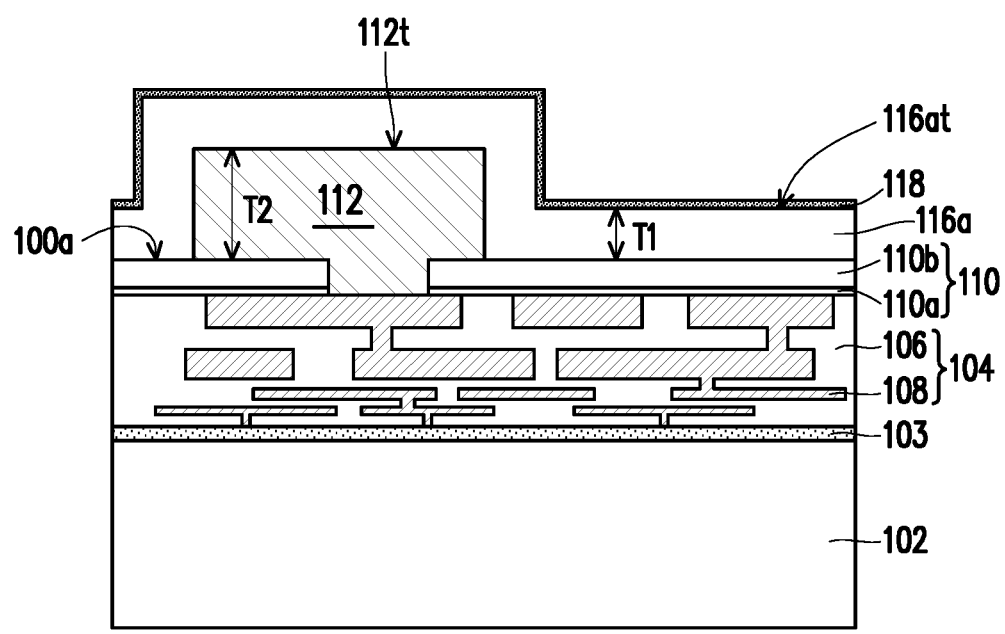

Referring to FIG. 1C, a first blocking layer 118 is conformally formed to cover the bonding dielectric material 116a. In some embodiments, the first blocking layer 118 includes a dielectric material, such as silicon oxide, silicon nitride, silicon oxynitride, or a combination thereof, and is formed by a suitable process such as CVD, ALD, or the like. In some embodiments, a thickness of the first blocking layer 118 is 0.05 µm to 0.1 µm.

Figure 1D:
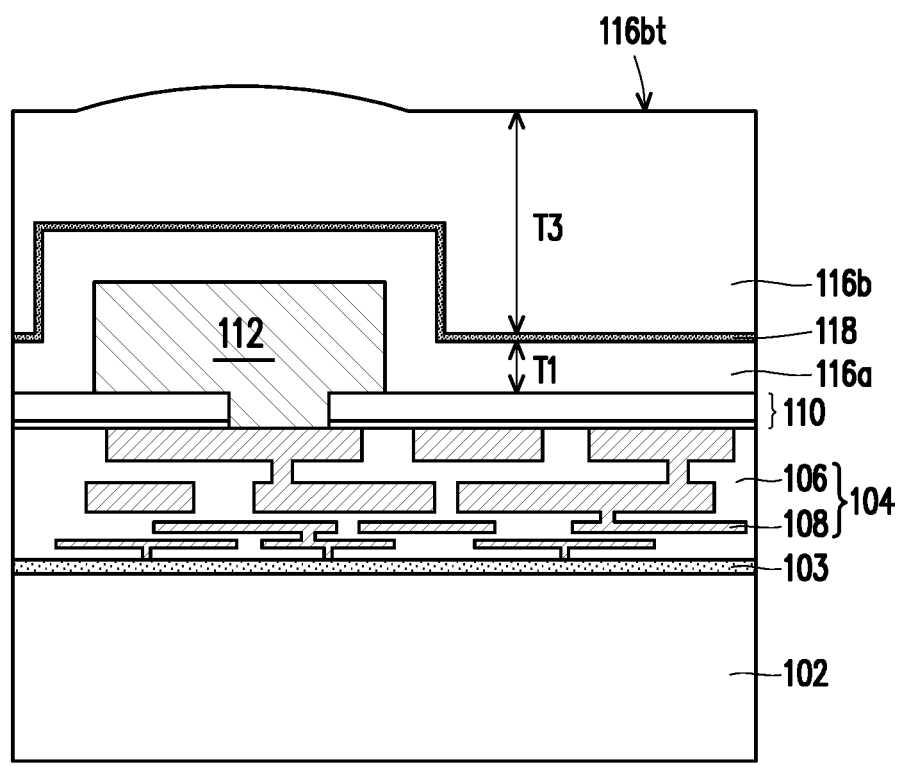

Referring to FIG. 1D, another bonding dielectric material 116b (or referred as a second bonding dielectric material) is formed over the first blocking layer 118. That is, the first blocking layer 118 is disposed between the bonding dielectric materials 116a and 116b. In some embodiments, a material of the first blocking layer 118 is different from that of the bonding dielectric material 116a and 116b. For example, the first blocking layer 118 may include silicon nitride, while, the bonding dielectric materials 116a and 116b may include silicon oxide. However, the embodiments of the present invention are not limited thereto. In other embodiments, the bonding dielectric material 116a and 116b and the first blocking layer 118 have different materials. In some embodiments, the bonding dielectric material 116b includes silicon oxide, silicon nitride, polymer or a combination thereof. The bonding dielectric material 116b is formed by a suitable process such as spin coating, CVD or the like. In some embodiments, a thickness T3 of the bonding dielectric material 116b over the passivation layer 110 is greater than the thickness T1 of the bonding dielectric material 116a. The thickness T3 of the bonding dielectric material 116b is 4.0 μm to 8.0 μm, for example. Herein, the thickness T3 of the bonding dielectric material 116b is referred as a thickness of the bonding dielectric material 116b over the first passivation layer 110. After the bonding dielectric material 116b is formed, a top surface 116bt of the bonding dielectric material 116b has an uneven surface or an undulated surface because of a height difference between the first pad 112 and the first passivation layer 110.

Figure 1E:
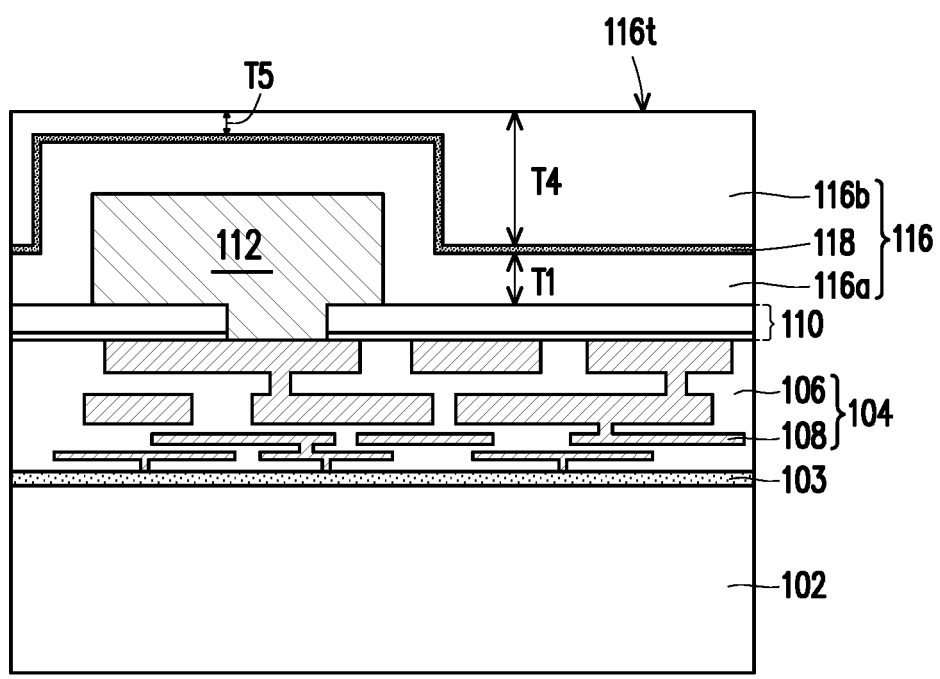

Referring to FIG. 1D and FIG. 1E, a planarization process is performed on the bonding dielectric material 116b. In some embodiments, the planarization process includes a CMP process, an etching back process, or a combination thereof. After the planarization process is performed, a first bonding dielectric layer 116 is formed. As shown in FIG. 1E, the first bonding dielectric layer 116 may include the bonding dielectric materials 116a and 116b and the first blocking layer 118 between the bonding dielectric materials 116a and 116b. During the planarization process, a portion of the bonding dielectric material 116b is removed, so that the thickness T3 of the bonding dielectric material 116b over the passivation layer 110 is thinned to a thickness T4 of the bonding dielectric material 116b. In some embodiments, a thickness T4 of the bonding dielectric material 116b is 2.0 μm to 4.0 μm. In some alternative embodiments, the thickness T4 of the bonding dielectric material 116b is greater than or equal to the thickness T1 of the bonding dielectric material 116a. In other embodiments, a thickness T5 of the bonding dielectric material 116b over the first pad 112 is less than the thickness T4 of the bonding dielectric material 116b over the passivation layer 110.

Figure 1F:
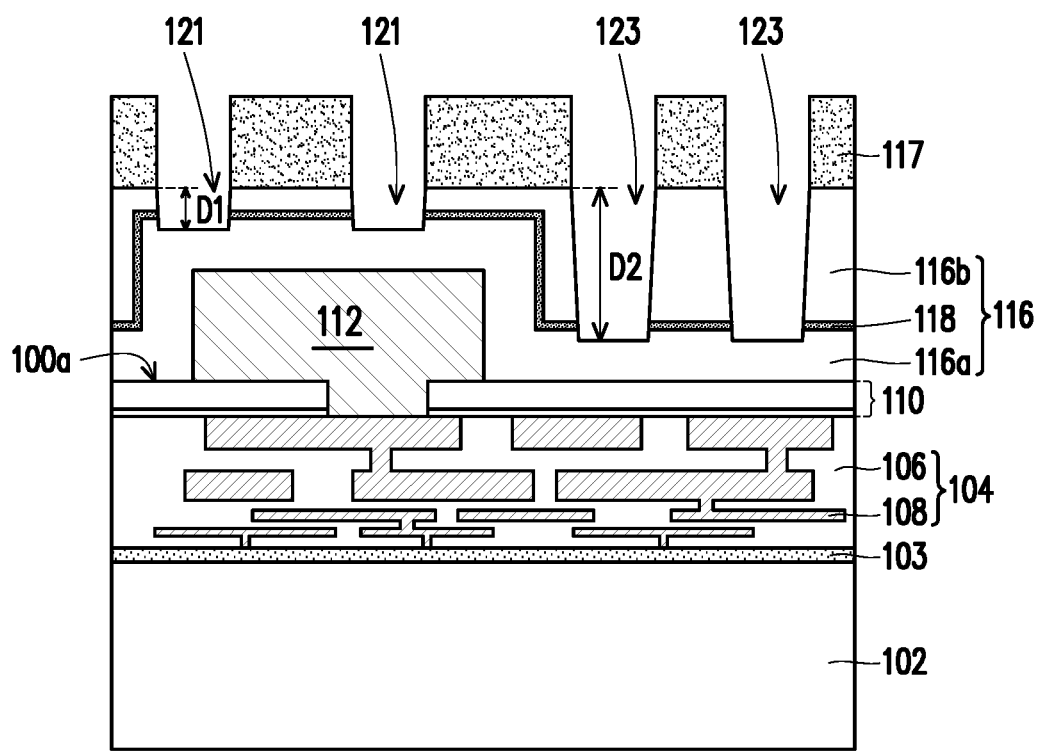

Referring to FIG. 1E and FIG. 1F, a resist pattern 117 (or referred as first resist pattern 117) is formed over the first bonding dielectric layer 116. An etching process is performed to remove a portion of the bonding dielectric material 116b is removed by using the resist pattern 117 as a mask, so as to form openings 121 and 123 in the bonding dielectric material 116b. In the embodiment, the block layer 118 is used as an etching stop layer, thus, the openings 121 and 123 have different depths. In detail, the opening 121 is stop at the block layer 118 until the opening 123 is formed. After the openings 121 and 123 are formed, a portion of the block layer 118 is also removed to expose the surface of the bonding dielectric material 116a. In some embodiments, a few portion of the bonding dielectric material 116a is also removed. In some embodiments, the etching process includes an anisotropic etching process. In some alternative embodiments, the etching process includes a dry etching process, such as a reactive-ion etching (RIE) process or the like.

In an embodiment, a depth D1 of the opening 121 is less than a depth D2 of the opening 123 as shown in FIG. 1F. The opening 121 is formed over the first pad 112, and the opening 123 is formed laterally aside or adjacent to the first pad 112. In addition, the opening 121 or the opening 123 illustrated in FIG. 1F has slanted sidewalls, however, the embodiments of the present invention are not limited thereto. In other embodiments, the sidewalls of the opening 121 or the opening 123 may be perpendicular with respect to front side 100b of the first die 100.

Figure 1G:
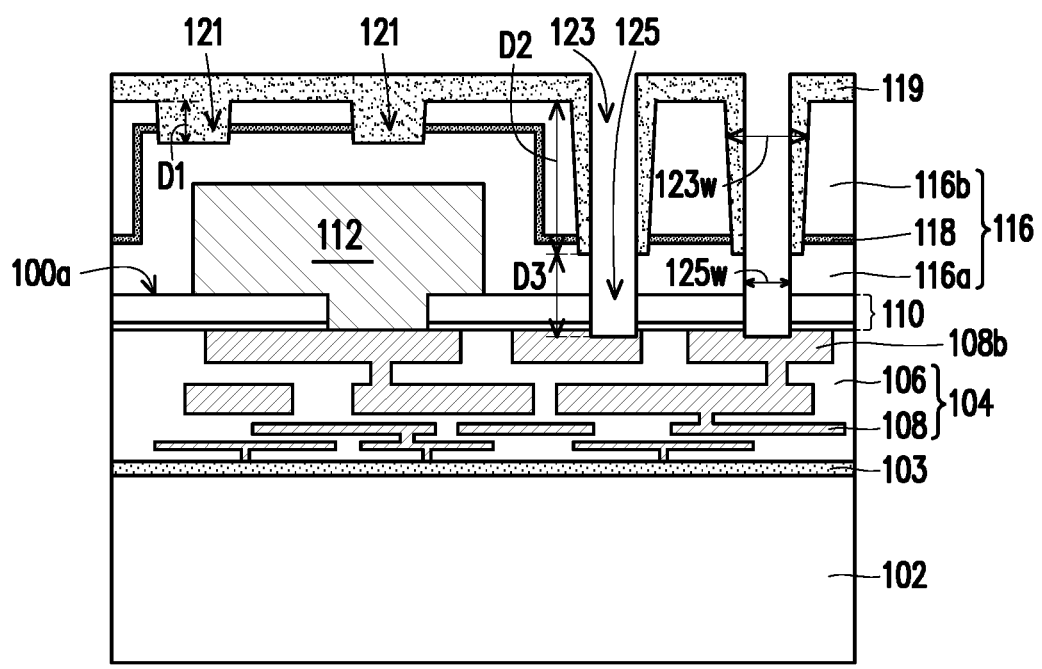

Referring to FIG. 1F and FIG. 1G, after the resist pattern 117 is removed, another resist pattern 119 (or referred as second resist pattern 119) is formed over the first bonding dielectric layer 116. In detail, the resist pattern 119 fills up the opening 121 and extends to cover sidewalls of the opening 123. Thereafter, another etching process is performed to remove a portion of the bonding dielectric material 116a and a portion of the first passivation layer 110 below the opening 123 by using the resist pattern 119 as a mask, so as to form via hole 125 in the bonding dielectric material 116a and the first passivation layer 110. In some embodiments, the another etching process includes an anisotropic etching process. In some alternative embodiments, the another etching process includes a dry etching process, such as a reactive-ion etching (RIE) process or the like.

In the case, the via hole 125 is in spatial communication with the opening 123 and expose the top metal feature 108b of the first interconnect structure 104. In some embodiments, a width 123w of the opening 123 is greater than a width 125w of the via hole 125. In some alternative embodiments, the depth D2 of the opening 123 is greater than or equal to a depth D3 of the via hole 125. Herein, the width 123w is referred as an average width of the opening 123 or a width of the middle portion of the opening 123. Similarly, the width 125w is referred as an average width of the via hole 125 or a width of the middle portion of the via hole 125. In addition, the via hole 125 illustrated in FIG. 1G has perpendicular sidewalls, however, the embodiments of the present invention are not limited thereto. In other embodiments, the sidewalls of the via hole 125 may be slanted or tilted with respect to front side 100b of the first die 100.

It should be noted that, in some embodiments, the opening 121 or opening 123 may be a cylindrical opening passing through the bonding dielectric material 116b and the first blocking layer 118, and partially into the bonding dielectric material 116a. However, the embodiments of the present invention are not limited thereto. In other embodiments, the opening 121 or opening 123 may be any shape, such as rectangle, ellipse etc., from the top view. Similarly, the via hole 125 may be a cylindrical opening with the width 125w less than the width 123w of the opening 123. In other embodiments, the via hole 125 may be any shape, such as rectangle, ellipse etc., from the top view.

Figure 1H:
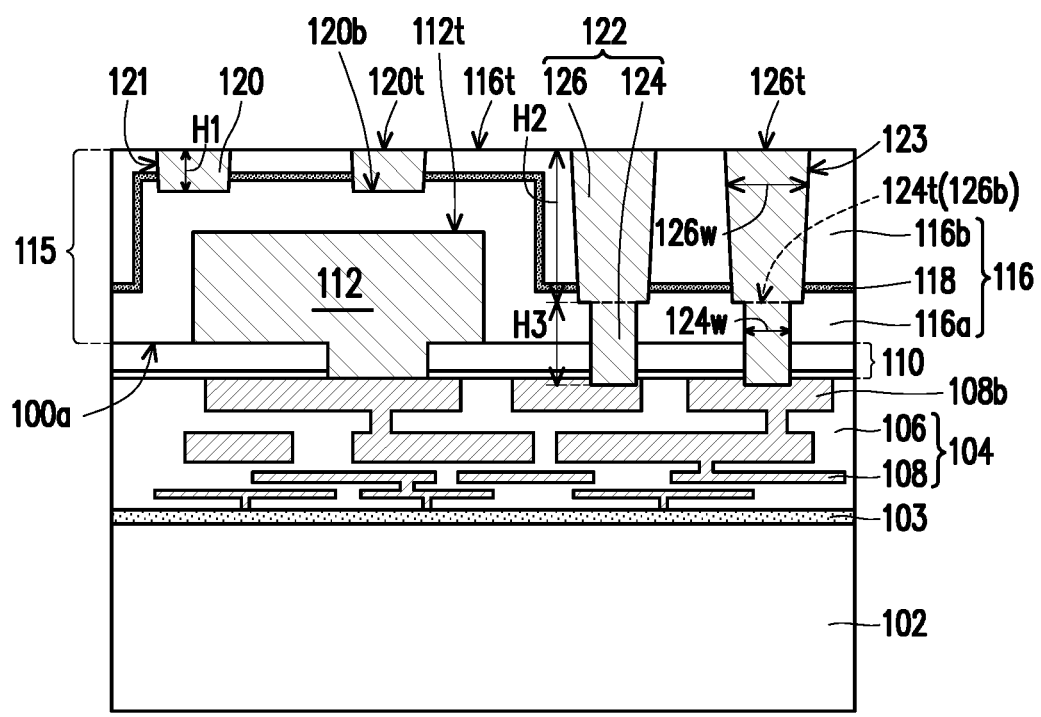

Referring to FIG. 1G and FIG. 1H, after the resist pattern 119 is removed, a conductive material (not shown) is formed to fill the openings 121 and 123, and a planarization process is then performed on the conductive material to expose a top surface 116t of the first bonding dielectric layer 116. In some embodiments, the planarization process includes a CMP process, an etching back process, or a combination thereof. After the planarization process is performed, a first bonding metal layer 122 and a dummy metal feature 120 are formed. The first bonding metal layer 122 includes the via plug 124 and the metal feature 126 over the via plug 124. The first bonding metal layer 122 penetrates through the first bonding dielectric layer 116, and the dummy metal feature 120 does not penetrate through the first bonding dielectric layer 116.

In other words, a via plug 124 is formed in the via hole 125, and a metal feature 126 is formed in the opening 123. The dummy metal feature 120 is formed in the opening 121. Herein, when elements are described as "dummy", the elements are electrically floating or electrically isolated from other elements. For example, as shown in FIG. 1H, the first dummy metal feature 120 is electrically floating.

As shown in FIG. 1H, the via plug 124 of the first bonding metal layer 122 penetrates through the bonding dielectric material 116a and the first passivation layer 110, and is in contact with the first metal features 108. The metal features 126 penetrates through the bonding dielectric material 116b and the first blocking layer 118, and partially into the bonding dielectric material 116a. In addition, the metal features 126 is disposed over and connected with the via plug 124. In other words, the metal feature 126 is electrically connected to the first metal features 108 through the via plug 124. On the other hand, the dummy metal feature 120 separated from the first pad 112 by a portion of the bonding dielectric material 116a.

In some embodiments, the first bonding metal layer 122 may include copper, copper alloys, nickel, aluminum, tungsten, a combination of thereof. The first dummy metal feature 120 may include copper, copper alloys, nickel, aluminum, tungsten, a combination of thereof. In some embodiments, the first dummy metal feature 120 and the first bonding metal layer 122 may have the same material. In some alternatively embodiments, the first dummy metal feature 120 and the first bonding metal layer 122 may have different materials.

In some embodiments, the first dummy metal feature 120 and the metal feature 126 are formed at the same time. In some other embodiments, the first dummy metal feature 120 and the metal feature 126 are successively formed. The forming of the first dummy metal feature 120 and the first bonding metal layer 122 illustrated in FIG. 1B to FIG. 1H is an opening first process, however, the embodiments of the present invention are not limited thereto. In other embodiments, the forming of the first dummy metal feature 120 and the first bonding metal layer 122 may be a via hole first process or a self-aligned process. For example, the first dummy metal feature 120 and the first bonding metal layer 122 are formed as following steps (referred as a via hole first process). The bonding dielectric materials 116a and 116b, the first blocking layer 118 and the first passivation layer 110 are patterned by lithography and etching processes to form via holes 125. Next, the bonding dielectric material 116b is patterned by lithography and etching processes to form openings 121 and 123 therein. Thereafter, the conductive material is formed and the planarization process is then performed.

In alternative embodiments, the first dummy metal feature 120 and the first bonding metal layer 122 are formed as following steps (referred as the self-aligned process). After the bonding dielectric material 116a is formed, the first blocking layer 118 is formed and patterned by lithography and etching processes to form via hole patterns therein. Next, the bonding dielectric material 116b is formed over the first blocking layer 118 with the via hole patterns. The bonding dielectric material 116b fills into the via hole patterns of the first blocking layer 118 and is in contact with the bonding dielectric material 116a. Thereafter, a patterned mask with opening patterns is formed on the bonding dielectric material 116b by a lithography process, some of the opening patterns are corresponding to the via hole patterns of the first blocking layer 118. Thereafter, an etching process is performed on the bonding dielectric material 116b by using the first blocking layer 118 as an etching stop layer, so that the opening 121 and 123 are formed. At the same time, the bonding dielectric material 116a is etched by using the first blocking layer 118 with the via hole patterns as a hard mask, so that via hole 125 is formed in the bonding dielectric material 116a and self-aligned with the opening 123. Thereafter, the conductive material is formed and the planarization process is then performed.

As shown in FIG. 1H, in some embodiments, the bonding structure 115 includes the first bonding dielectric layer 116, and the first bonding metal layer 122. In some other embodiments, the bonding structure 115 further includes the dummy metal feature 120. The dummy metal feature 120 is formed in the bonding dielectric material 116b, and the first bonding metal layer 122 is formed in the bonding dielectric materials 116a and 116b and the first blocking layer 118. In some embodiment, a top surface 120t of the first dummy metal feature 120, a top surface 126t of the metal feature 126 of the first bonding metal layer 122, and the top surface 116t of the first bonding dielectric layer 116 are substantially coplanar. In addition, the bottom surface 126b of the metal feature 126 is lower than the top surface 112t of the first pad 112, and the bottom surface 120b of the dummy metal feature 120 is higher than the top surface 120t of the first pad 112. A top surface 124t of the via plug 124 is lower than the top surface 112t of the pad 112.

As shown in FIG. 1H, in some embodiments, a height H2 of the metal feature 126 of the first bonding metal layer 122 is greater than a height H1 of the dummy metal feature 120. A ratio of the height H2 of the metal feature 126 to the height H1 of the dummy metal feature 120 is 4 to 2, for example. The height H2 of the metal feature 126 of the first bonding metal layer 122 is greater than or equal to a height H3 of the via plug 124 of the first bonding metal layer 122. A ratio of the height H2 of the metal feature 126 to the height H3 of the via plug 124 is 0.75 to 3, for example.

In some alternative embodiments, a width 126w of the metal feature 126 is greater than a width 124w of the via plug 124, as shown in FIG. 1H. Herein, the width 126w is referred as an average width of the metal feature 126 or a width of the middle portion of the metal feature 126. Similarly, the width 124w is referred as an average width of the via plug 124 or a width of the middle portion of the via plug 124. A ratio of the width 126w of the metal feature 126 to the width 124w of the via plug 124 is 1.0 to 3, for example. However, the embodiments of the present invention are not limited thereto. In other embodiments, the metal feature 126 and the via plug 124 may be referred as a whole tapered structure. In other words, sidewalls of the metal feature 126 and the via plug 124 are continuous slope surface without disconnection (or step difference).

In addition, the metal feature 126 illustrated in FIG. 1H has slanted or tilted sidewalls, however, the embodiments of the present invention are not limited thereto. In other embodiments, the sidewalls of the metal feature 126 may be perpendicular with respect to front side 100b of the first die 100. Similarly, the via plug 124 illustrated in FIG. 1H has perpendicular sidewalls, however, the embodiments of the present invention are not limited thereto. In other embodiments, the sidewalls of the via plug 124 may be slanted or tilted with respect to front side 100b of the first die 100.

It should be noted that the resistance of the metal feature 126 is lower than the resistance of the via plug 124 since the height H2 and the width 126w of the metal feature 126 are greater than the height H3 and the width 124w of the via plug 124. That is, the conductivity of the first bonding metal layer 122 is getting better as the volume of the first bonding metal layer 122 increases. From another perspective, the thermal dissipation of the first bonding metal layer 122 is also better. The first bonding metal layer 122 is able to connected to the first interconnect structure 104 to aid in dissipating the heat from the devices within the first device layer 103. Herein, the first bonding metal layer 122 is not only a connector, but also a heat dissipater. Therefore, the electrical and thermal performances of the 3DIC structure 10 (as shown in FIG. 1I) can be improved by increasing the ratio of the metal feature 126 in the first bonding metal layer 122.

Figure 1I:
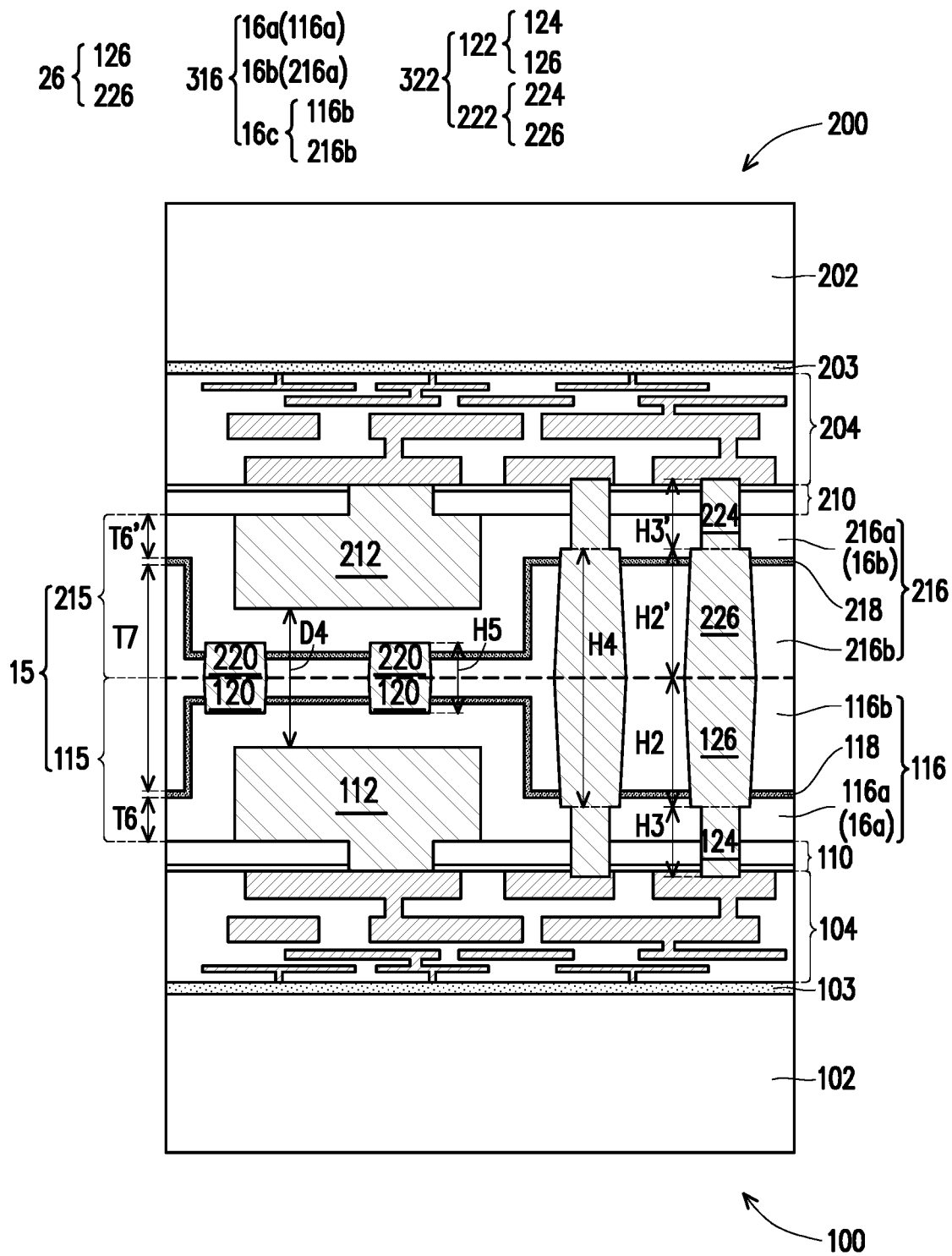

Referring to FIG. 1I, a second die 200 is provided. The second die 200 may be an application-specific integrated circuit (ASIC) chip, an analog chip, a sensor chip, a wireless and radio frequency chip, a voltage regulator chip or a memory chips, for example. The second die 200 and the first die 100 may be the same type of dies or different types of dies.

In some embodiments, the second die 200 is similar to the first die 100. That is, the second die 200 includes a second semiconductor substrate 202, a second device region 203, a second interconnect structure 204, a second passivation layer 210, and a second pad 212. The arrangement, material and forming method of the second die 200 are similar to the arrangement, material and forming method of the first die 100. Thus, details thereof are omitted here. The first die 100 and the second die 200 illustrated in FIG. 1I have the same size. Herein, the term "size" is referred to the length, width, or area. For example, as shown in FIG. 1I, the length of the second die 100 is greater than the length of the first die 100. However, the embodiments of the present invention are not limited thereto. In other embodiments, the size of the first die 100 is different from the size of the second die 200. For example, the first die 100 may be a wafer, the second die 200 may be a die and disposed over the wafer as a chip-on-wafer (CoW) structure.

Referring to FIG. 1I, a second bonding structure 215 is formed over a front side 200a of the second die 200. In some embodiments, the second bonding structure 215 includes a second bonding dielectric layer 216 and a second bonding metal layer 222. In some other embodiments, the second bonding structure 215 further includes a second dummy metal feature 220. The second dummy metal feature 220 is corresponding to the second pad 212. The second bonding dielectric layer 216 includes bonding dielectric materials 216a and 216b and a second blocking layer 218 between the bonding dielectric materials 216a and 216b. The second bonding metal layer 222 is formed laterally aside and adjacent to the second pad 222. The second bonding metal layer 222 includes a via plug 224 and a metal feature 226 disposed over the via plug 224.

Referring to FIG. 1I, the second die 200 is further turned upside down and mounted onto the first die 100. In detail, as shown in FIG. 1I, the first die 100 and the second die 200 are face-to-face bonded together via the first bonding structure 115 and the second bonding structure 215 to form a die stack structure 10 (or referred as a 3DIC structure 10). However, the embodiments of the present invention are not limited thereto. In other embodiments, the first die 100 and the second die 200 may be face-to-back bonded together. In some embodiments, before the first die 100 is bonded to the second die 200, the first bonding structure 115 and the second bonding structure 215 are aligned, such that the first dummy metal feature 120 may be bonded to the second dummy metal feature 220, the first bonding metal layer 122 may be bonded to the second bonding metal layer 222, and the first bonding dielectric layer 116 may be bonded to the second bonding dielectric layer 216. In some embodiments, the alignment of the first bonding structure 115 and the second bonding structure 215 may be achieved by using an optical sensing method. After the alignment is achieved, the first bonding structure 115 and the second bonding structure 215 are bonded together by a hybrid bonding to form a hybrid bonding structure 15.

The first bonding structure 115 and the second bonding structure 215 are hybrid bonded together by the application of pressure and heat. It is noted that the hybrid bonding involves at least two types of bonding, including metal-to-metal bonding and non-metal-to-non-metal bonding such as dielectric-to-dielectric bonding or fusion bonding. As shown in FIG. 1I, the hybrid bonding structure 15 includes the first dummy metal feature 120 and the second dummy metal feature 220 bonded by metal-to-metal bonding, the first bonding metal layer 122 and the second bonding metal layer 222 bonded by metal-to-metal bonding, and the first bonding dielectric layer 116 and the second bonding dielectric layer 216 bonded by non-metal-to-non-metal bonding. However, the embodiments of the present invention are not limited thereto. In other embodiments, the first bonding structure 115 and the second bonding structure 215 may be bonded together by other bonding, such as fusion bonding.

From another perspective, the hybrid bonding structure 15 include a dielectric layer 316 and a conductive feature 322. In detail, the dielectric layer 316 may include the first bonding dielectric layer 116 and the second bonding dielectric layer 216. The conductive feature 322 may include the via plug 124 (also referred as a first via plug), a via plug 224 (also referred as a second via plug), and a middle portion 26 (which includes the metal features 126 and 226). The via plug 124 is electrically connected to the first die 100, and the via plug 224 is electrically connected to the second die 200. The middle portion 26 is electrically connected to the via plug 124 and via plug 224. In some embodiments, a height H4 of the middle portion 26 is greater than a distance D4 between the first pad 112 of the first die 100 and the second pad 212 of the second die 200. In some alternative embodiments, the height H4 of the middle portion 26 is greater than or equal to a sum height (H3+H3') of the via plug 124 and the via plug 224.

As shown in FIG. 1I, the dielectric layer 316 includes the bonding dielectric materials 116a, 116b, 216a, and 216b. In some embodiments, the bonding dielectric material 116a (also referred as a first dielectric material 16a) conformally covers the first die 100. The bonding dielectric material 216a (also referred as a second dielectric material 16b) conformally covers the second die 200. A stack of the bonding dielectric materials 116b and 216b (also referred as a third dielectric material 16c) is disposed between the first dielectric material 16a and the second dielectric material 16b. The middle portion 26 penetrates the third dielectric material 16c and partially into the first dielectric material 16a and the second dielectric material 16b. The via plug 124 is formed in the first dielectric material 16a, and the via plug 224 is formed in the second dielectric material 16b. In some embodiments, a thickness T7 of the third dielectric material 16c is greater than or equal to a sum thickness (T6+T6') of the first dielectric material 16a and the second dielectric material 16b. Herein the thickness T7 of the third dielectric material 16c is referred as the thickness of the third dielectric material 16c between the first passivation layer 110 and the second passivation layer 210.

As shown in FIG. 1I, the first blocking layer 118 is disposed between the first dielectric material 16a and the third dielectric material 16c and the second blocking layer 218 is disposed between the second dielectric material 16b and the third dielectric material 16c. The 3DIC structure 10 further includes the first dummy metal feature 120 and the second dummy metal feature 220. The first dummy metal feature 120 is disposed in and exposed by the first dielectric material 16a over the first pad 112 of the first die 100. The second dummy metal feature 220 is disposed in and exposed by the second dielectric material 16b over the second pad 212 of the second die 200. The first dummy metal feature 120 and the second dummy metal feature 220 are bonded together and a sum height H5 of the first and second dummy metal features 120 and 220 is less than the height H4 of the middle portion 26.

Although the die stack structure 10 illustrated in FIG. 1I include the first die 100 and the second die 200 having the height H2/H2' of the metal feature 126/226 greater than or equal to the height H3/H3' of the via plug 124/224, the embodiments of the present invention are not limited thereto. In other embodiments, one of the first die 100 and the second die 200 has the height H2/H2' of the metal feature 126/226 greater than or equal to the height H3/H3' of the via plug 124/224, while another of the first die 100 and the second die 200 has the height H2/H2' of the metal feature 126/226 less than the height H3/H3' of the via plug 124/224.

Figure 2:
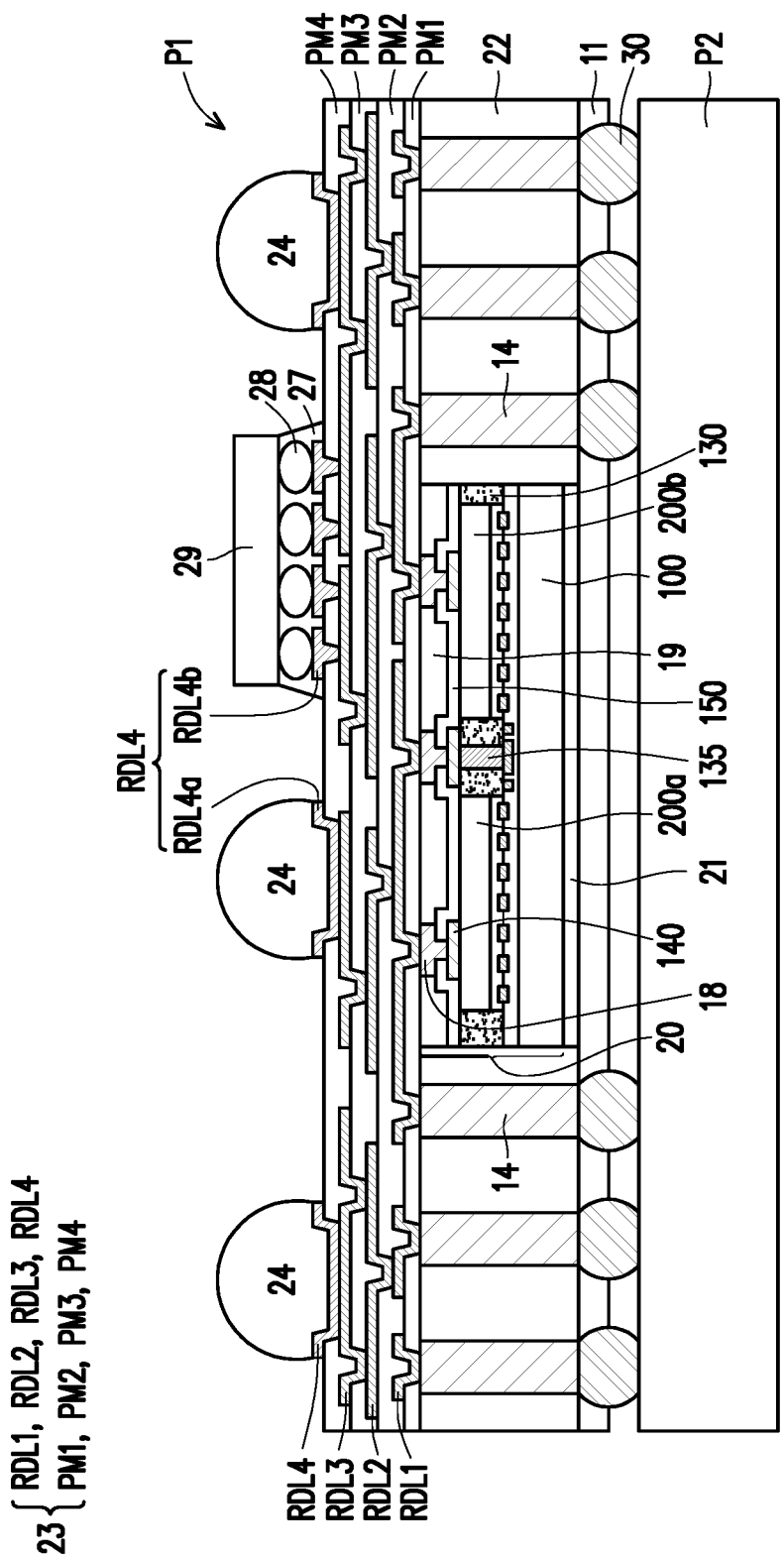
FIG. 2 is a cross-sectional view of a package in accordance with some embodiments.

In some embodiments, after forming the die stack structure 10, a gap-fill dielectric layer 130 (as shown in FIG. 2) is formed to laterally encapsulates the second die 200. In some embodiments, the gap-fill dielectric layer 130 may include oxide such as silicon oxide, nitride such as silicon nitride, oxynitride such as silicon oxynitride, a molding compound, a molding underfill, a resin such as epoxy, a combination thereof, or the like. A metal circuit structure 140 (as shown in FIG. 2) is then formed over the die stack structure 10. In some embodiments, the metal circuit structure 140 is in contact with through-silicon vias (TIVs, not shown) in the second die 200. At least one through-dielectric via (TDV) 135 (as shown in FIG. 2) is then formed in the gap-fill dielectric layer 130 to electrically connect the first die 100 and the metal circuit structure 140.

FIG. 2 is a cross-sectional view of a package in accordance with some embodiments.

Referring to FIG. 2, a 3DIC structure 20 is mounted over a dielectric layer 11 by an adhesive layer 21. In some embodiments, the 3DIC structure 20 may be the foregoing 3DIC structure 10 (which may include the gap-fill dielectric layer, metal circuit structure, and TSVs). The 3DIC structure 20 includes a plurality of second dies 200a and 200b arranged in parallel over the first die 100. The second dies 200a and 200b and the first die 100 are face-to-face or face-to-back bonded together. The number of the second dies 200a and 200b is not limited in this disclosure.

In the embodiment, the 3DIC structure 20 further includes a plurality of connectors 18 and a passivation layer 19. The connectors 18 are formed over and electrically connected to the metal circuit structure 140 not covered by the passivation layer 150. Other components below the bonding pads 140, such as the dielectric layer and the metal feature, are not illustrated in FIG. 2 for clarity. The connector 18 includes solder bumps, gold bumps, copper bumps, copper posts, copper pillars, or the like. The passivation layer 19 is formed over the passivation layer 150 and laterally encapsulates the connectors 18.

Referring to FIG. 2, an insulating encapsulation 22 is formed aside the 3DIC structure 20 to laterally encapsulate the 3DIC structure 20. A plurality of conductive posts 14 are formed in the insulating encapsulation 22 and surround the 3DIC structure 20. A redistribution layer (RDL) structure 23 is formed over and electrically connected to the 3DIC structure 20 and the conductive posts 14. In some embodiments, the RDL structure 23 includes a plurality of polymer layers PM1, PM2, PM3 and PM4 and a plurality of redistribution layers RDL1, RDL2, RDL3 and RDL4 stacked alternately. The number of the polymer layers or the redistribution layers is not limited by the disclosure.

In detail, the redistribution layer RDL1 penetrates through the polymer layer PM1 and is electrically connected to the connectors 18 of the 3DIC structure 20 and the conductive posts 14. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3. In some embodiments, each of the polymer layers PM1, PM2, PM3 and PM4 includes a photo-sensitive material such as polybenzoxazole (PBO), polyimide (PI), benzocyclobutene (BCB), a combination thereof or the like. In some embodiments, each of the redistribution layers RDL1, RDL2, RDL3 and RDL4 includes conductive materials. The conductive materials include metal such as copper, nickel, titanium, a combination thereof or the like, and are formed by an electroplating process. In some embodiments, the redistribution layers RDL1, RDL2, RDL3 and RDL4 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers RDL1, RDL1, RDL3 and RDL4 respectively includes a plurality of vias and a plurality of traces connected to each other. The vias connects the traces, and the traces are respectively located on the polymer layers PM1, PM2, PM3 and PM4, and are respectively extending on the top surface of the polymer layers PM1, PM2, PM3 and PM4.

In some embodiments, the topmost redistribution layer RDL4 includes RDL4a and RDL4b. The redistribution layer RDL4a is also referred as under-ball metallurgy (UBM) layer for ball mounting. The redistribution layer RDL4b may be connection pad for connecting to an integrated passive device (IPD) 26 formed in the subsequent process.

Thereafter, a plurality of connectors 24 are formed over and electrically connected to the redistribution layer RDL4a of the redistribution layer structure 23. In some embodiments, the connectors 24 are made of a conductive material with low resistivity, such as Sn, Pb, Ag, Cu, Ni, Bi or an alloy thereof, and are formed by a suitable process such as evaporation, plating, ball drop, or screen printing. An (integrated passive device) IPD 29 is formed over and electrically connected to the redistribution layer RDL4b of the redistribution layer structure 23 through the solder bumps 28. The IPD 29 may be a capacitor, a resistor, an inductor or the like, or a combination thereof. The number of the IPD 29 is not limited to that is shown in FIG. 2, but may be adjusted according to the design of the product. An underfill layer 27 is formed between the IPD 29 and the polymer layer PM4, and surrounds and covers the exposed RDL4b, the solder bumps 28 and the bottom surface of the IPD 29.

As shown in FIG. 2, the dielectric layer 11 is then patterned such that bottom surfaces of the conductive posts 14 is exposed by the dielectric layer 11. After the conductive terminals 30 are formed over the bottom surfaces of the conductive posts 14 respectively, an integrated fan-out package P1 having dual-side terminals is accomplished. Another package P2 is then provided. In some embodiments, the package P2 is, for example, a memory device. The package P2 is stacked over and is electrically connected to the integrated fan-out package P1 through the conductive terminals 30 such that a package-on-package (POP) structure is fabricated.

FIG. 3A to FIG. 3H are cross-sectional views of a method of forming a 3DIC structure in accordance with a second embodiment.

Figure 3A:
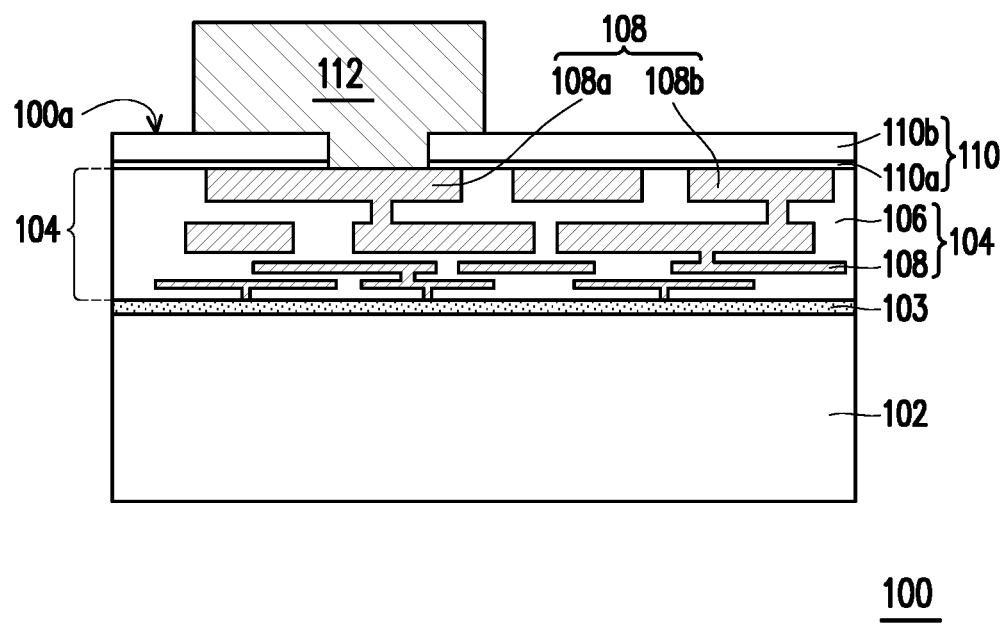
FIG. 3A to FIG. 3H are cross-sectional views of a method of forming a 3DIC structure in accordance with a second embodiment.
Figure 3B:
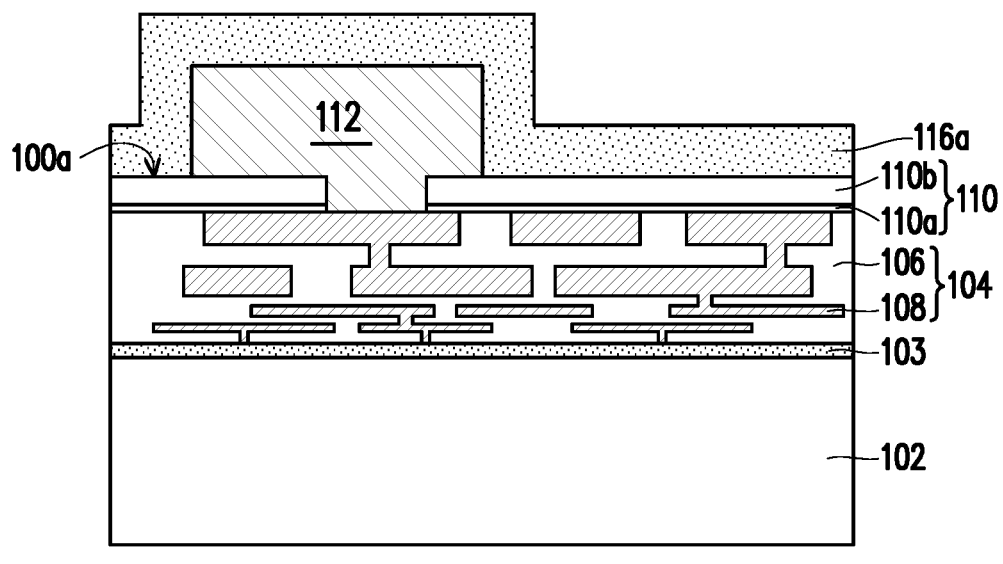
Figure 3C:
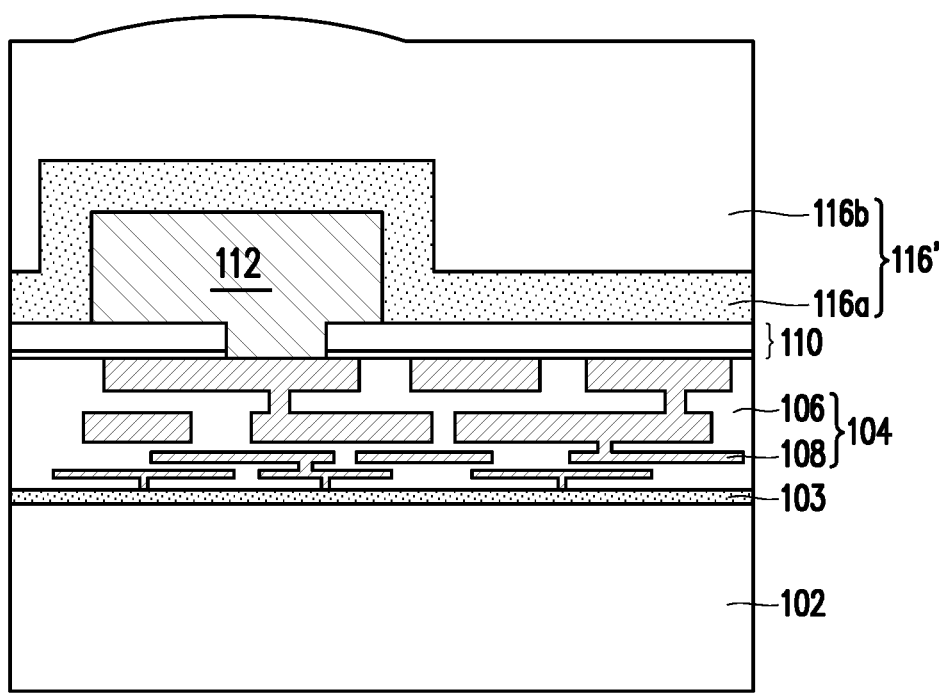
Figure 3D:
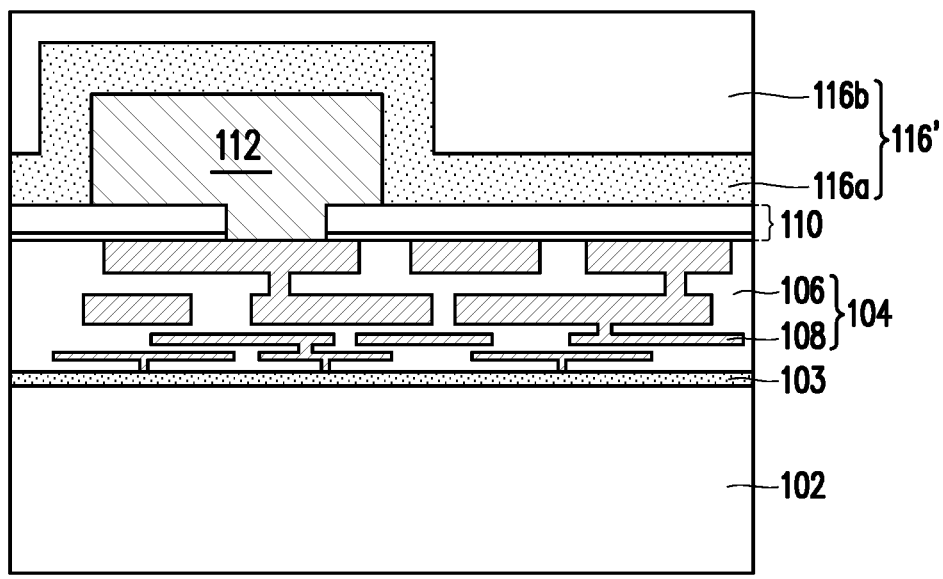
Figure 3E:
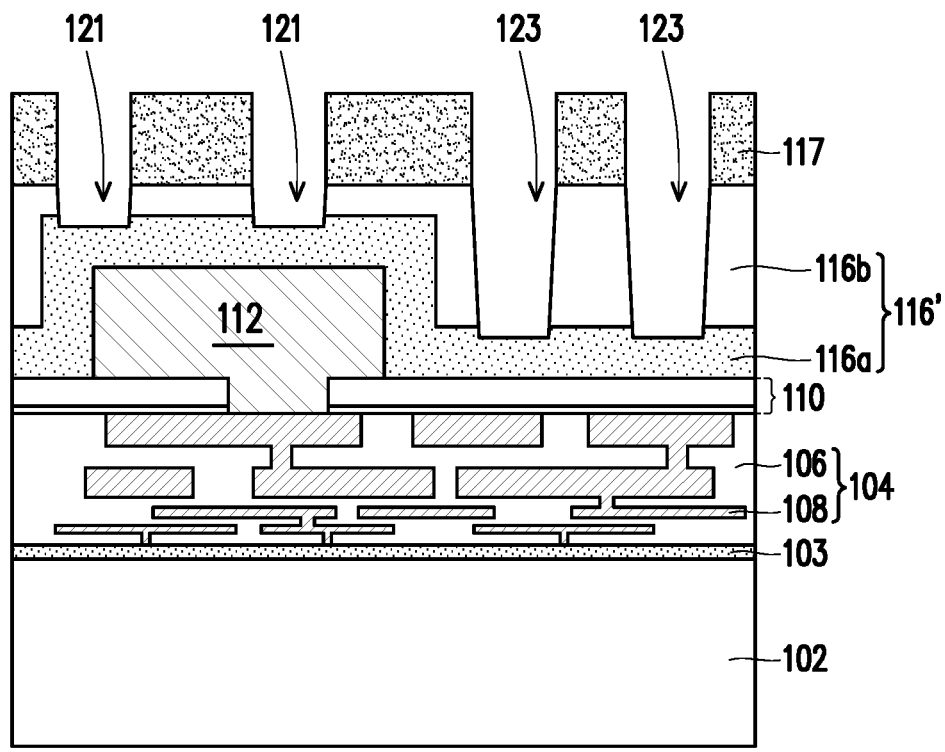
Figure 3F:
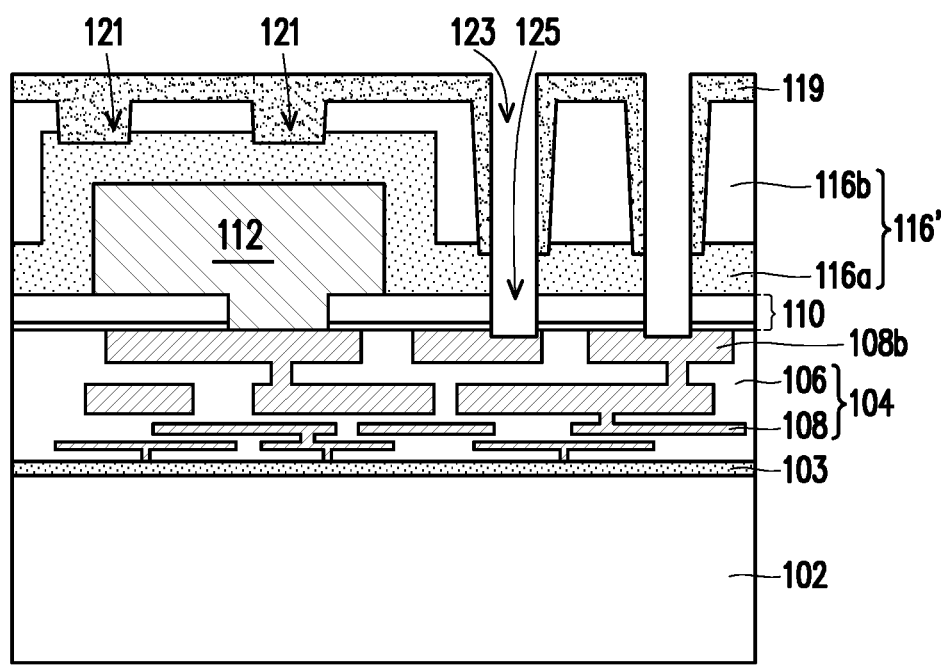
Figure 3G:
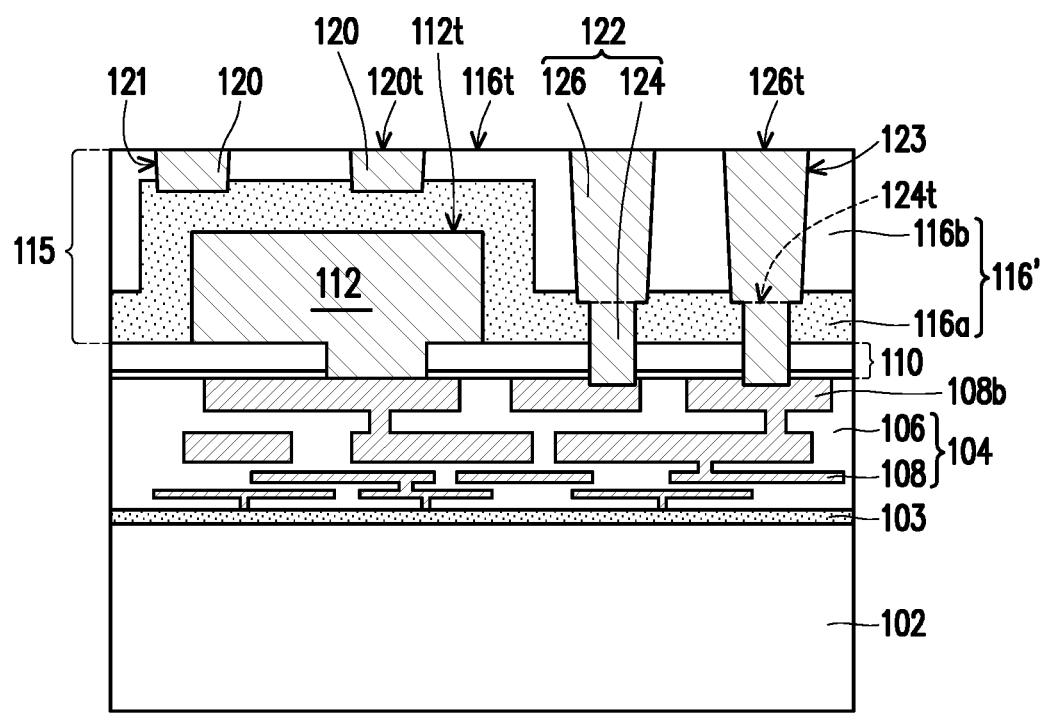
Figure 3H:
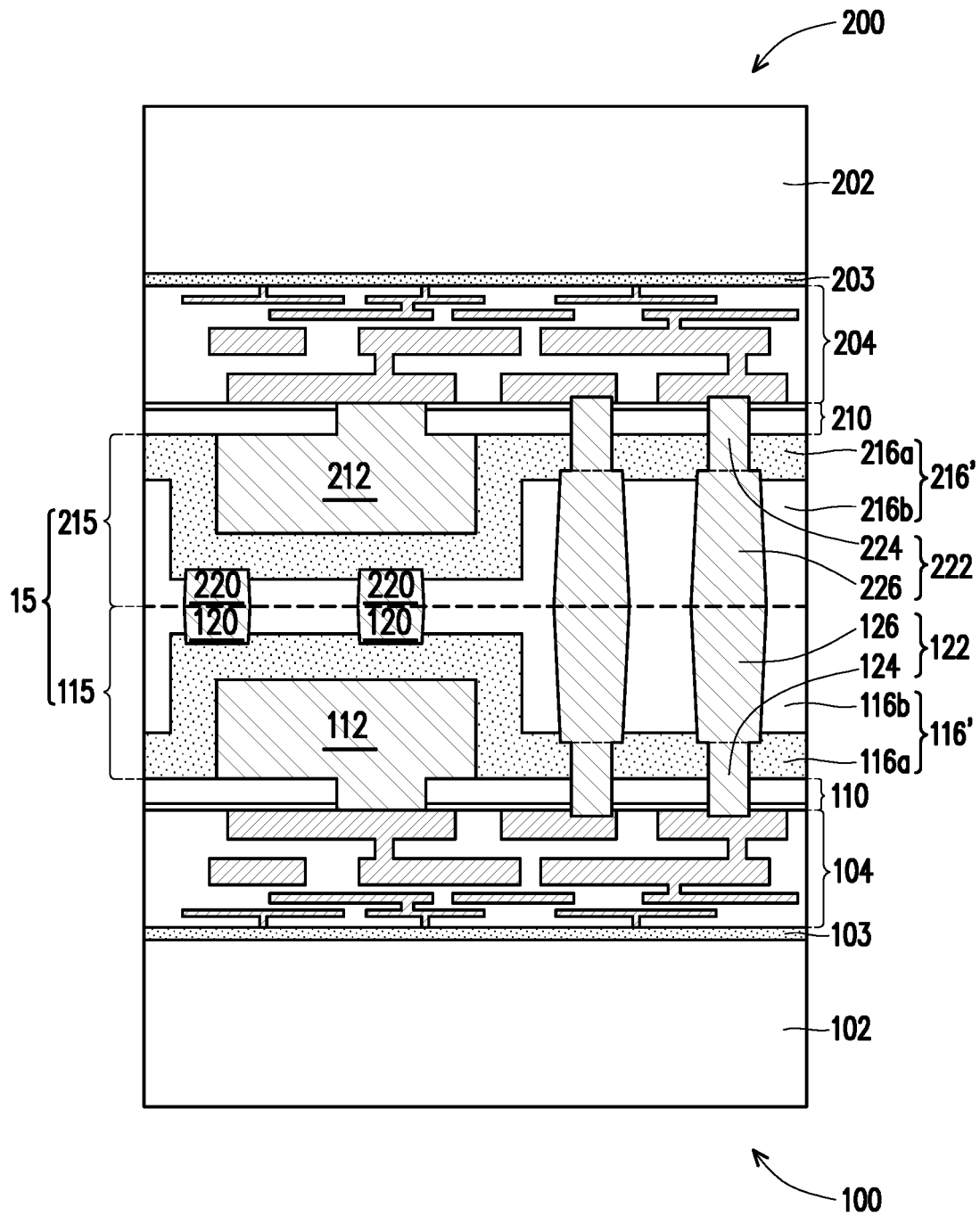

Referring to FIG. 3A to FIG. 3H, the method of forming a 3DIC structure 30 of the second embodiment is similar to the method of forming the 3DIC structure 10 of the first embodiment. A difference therebetween lies in that no blocking layer exists in a first bonding dielectric layer 116' and a second bonding dielectric layer 216'. In detail, the bonding dielectric material 116b is formed over and in physical contact with the bonding dielectric material 116a without the blocking layer, as shown in FIG. 3C. The bonding dielectric material 216b is formed over and in physical contact with the bonding dielectric material 216a without the blocking layer, as shown in FIG. 3H. Besides, the arrangement, material and forming method of the 3DIC structure 30 are similar to the arrangement, material and forming method of the 3DIC structure 10. Thus, details thereof are omitted here.

In addition, the bonding dielectric material 116a is referred as an etching stop layer when the openings 121 and 123 are formed, as shown in FIG. 3E. Specifically, the opening 121 is stop at the bonding dielectric material 116a until the opening 123 is formed. In the case, a few portion of the bonding dielectric material 116a is also removed. In some embodiments, the bonding dielectric materials 116a and 116b have different materials. For example, the bonding dielectric material 116a may be silicon nitride, while the bonding dielectric material 116b may be silicon oxide. However, the embodiments of the present invention are not limited thereto. In some alternative embodiments, the bonding dielectric materials 116a and 116b have high etching selectivity.

Although the 3DIC structure 30 illustrated in FIG. 3H include the first die 100 and the second die 200 both having no blocking layer in a first bonding dielectric layer 116' and a second bonding dielectric layer 216', the embodiments of the present invention are not limited thereto. In other embodiments, one of the first die 100 and the second die 200 has the blocking layer, while another of the first die 100 and the second die 200 has no blocking layer.

In accordance with some embodiments of the disclosure, a method of forming a semiconductor structure includes: forming an interconnect structure over a substrate; forming a pad over the interconnect structure, wherein the pad is electrically connected to the interconnect structure; forming a bonding dielectric layer over the interconnect structure; and forming a bonding metal layer in the bonding dielectric layer to electrically connect to the interconnect structure, wherein the bonding metal layer includes a via plug and a metal feature formed over the via plug, a height of the metal feature is greater than or equal to a height of the via plug.

In accordance with some embodiments of the disclosure, A method of forming a semiconductor structure includes: forming an interconnection structure over a substrate; forming a pad on the interconnection structure; forming a dielectric structure over the pad and the interconnection structure, wherein forming the dielectric structure includes: forming a first dielectric layer over the pad and the interconnection structure; and forming a second dielectric layer over the first dielectric layer, wherein the second dielectric layer includes a first portion directly over the pad and a second portion laterally aside the pad, and the second portion is thicker than the first portion; and forming a conductive structure in the dielectric structure to electrically connect to the interconnection structure, wherein the conductive structure includes a conductive feature penetrating through the second portion of second dielectric layer and a via plug connected to the conductive feature and penetrating through the first dielectric layer.

In accordance with some embodiments of the disclosure, A method of forming a semiconductor structure includes: forming a first die including a first bonding structure; and bonding the first die to a second die through a hybrid bonding process. The formation of the first bonding structure includes: forming a first dielectric structure on a first pad over an interconnection structure; forming a first metal layer in the first dielectric structure, wherein the first metal layer includes a metal feature and a via plug connected to each other; and forming a first dummy metal feature in the first dielectric structure, wherein a height of the dummy metal feature is less than a height of the metal feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
    forming an interconnect structure over a substrate;
    forming a pad over the interconnect structure, wherein the pad is electrically connected to the interconnect structure;
    after forming the pad, forming a bonding dielectric layer over the interconnect structure and the pad; and
    forming a bonding metal layer in the bonding dielectric layer to electrically connect to the interconnect structure, wherein the bonding metal layer comprises a via plug and a metal feature formed over the via plug, a height of the metal feature is greater than or equal to a height of the via plug, wherein the bonding metal layer extends in a thickness direction of the pad and extends above a top surface of the pad and below a bottom surface of the pad.

2. The method of claim 1, wherein forming the bonding dielectric layer over the interconnect structure comprises:
    forming a first bonding dielectric material to conformally cover the pad and the interconnect structure;
    forming a blocking layer to conformally cover the first bonding dielectric material; and
    forming a second bonding dielectric material over the blocking layer.

3. The method of claim 2, wherein a thickness of the second bonding dielectric material is greater than or equal to a thickness of the first bonding dielectric material.

4. The method of claim 3, wherein forming the bonding metal layer in the bonding dielectric layer comprises:
forming a first resist pattern over the substrate;
removing a portion of the second bonding dielectric material by using the blocking layer as an etching stop layer and by using the first resist pattern as a mask to form an opening;
forming a second resist pattern over the substrate;
removing a portion of the first bonding dielectric material by using the second resist pattern as a mask to form a via hole, wherein a depth of the opening is greater than or equal to a depth of the via hole; and
filling the opening and the via hole with a conductive material to form the metal feature in the opening and form the via plug in the via hole.

5. The method of claim 1, wherein forming the bonding dielectric layer over the interconnect structure comprises:
forming a first bonding dielectric material to conformally cover the pad and the interconnect structure; and
forming a second bonding dielectric material over the first bonding dielectric material, wherein the first bonding dielectric material and the second bonding dielectric material have different materials and a thickness of the second bonding dielectric material is greater than or equal to a thickness of the first bonding dielectric material.

6. The method of claim 5, wherein forming the bonding metal layer in the bonding dielectric layer comprises:
forming a first resist pattern over the substrate;
removing a portion of the second bonding dielectric material by using the first bonding dielectric material as an etching stop layer and by using the first resist pattern as a mask to form an opening;
forming a second resist pattern over the substrate;
removing a portion of the first bonding dielectric material by using the second resist pattern as a mask to form a via hole, wherein a depth of the opening is greater than or equal to a depth of the via hole; and
filling the opening and the via hole with a conductive material to form the metal feature in the opening and form the via plug in the via hole.

7. The method of claim 1, further comprising: forming a dummy metal feature over the pad, wherein dummy metal feature and the metal feature are formed simultaneously, and a height of the dummy metal feature is less than the height of the metal feature.

8. A method of forming a semiconductor structure, comprising:
forming an interconnection structure over a substrate;
forming a pad on the interconnection structure;
forming a dielectric structure over the pad and the interconnection structure, comprising:
forming a first dielectric layer over the pad and the interconnection structure; and
forming a second dielectric layer over the first dielectric layer, wherein the second dielectric layer comprises a first portion directly over the pad and a second portion laterally aside the pad, and the second portion is thicker than the first portion; and
forming a conductive structure in the dielectric structure to electrically connect to the interconnection structure, wherein the conductive structure comprises a conductive feature penetrating through the second portion of second dielectric layer and a via plug connected to the conductive feature and penetrating through the first dielectric layer.

9. The method of claim 8, wherein forming the conductive structure further comprises: forming a dummy conductive feature in the first portion of the second dielectric layer.

10. The method of claim 9, wherein the dummy conductive feature is formed to be separated from the pad by a portion of the first dielectric layer disposed therebetween.

11. The method of claim 9, wherein the dummy conductive feature is formed to have a bottom surface higher than a bottom surface of the conductive feature.

12. The method of claim 8, wherein the first dielectric layer is formed to be a conformal layer, and forming the second dielectric layer comprises: forming a dielectric material layer over the first dielectric layer; and performing a planarization process on the dielectric material layer.

13. The method of claim 8, wherein the second portion of the second dielectric layer is formed to have a bottom surface lower than a top surface of the pad.

14. The method of claim 8, further comprising:
forming a blocking layer between the first dielectric layer and the second dielectric layer; and
the conductive feature is formed to further penetrate through the blocking layer.

15. A method of forming a semiconductor structure, comprising:
forming a first die comprising a first bonding structure, wherein forming the first bonding structure comprises:
forming a first dielectric structure on a first pad over an interconnection structure;
forming a first metal layer in the first dielectric structure, wherein the first metal layer comprises a metal feature and a via plug connected to each other;
forming a first dummy metal feature in the first dielectric structure, wherein a height of the dummy metal feature is less than a height of the metal feature; and
bonding the first die to a second die through a hybrid bonding process.

16. The method of claim 15, wherein the height of the metal feature is larger than a vertical distance between a top surface of the first dielectric structure and a top surface of the first pad.

17. The method of claim 15, wherein the first metal layer is formed laterally aside the first pad and penetrating through the first dielectric structure to be electrically connected to the interconnection structure, while the first dummy metal feature is formed in an upper portion of the first dielectric structure directly over the first pad and separated from the first pad.

18. The method of claim 15, wherein forming the first dielectric structure comprises:
forming a first dielectric layer to cover the pad and the interconnection structure, wherein the first dielectric layer has a first top surface and a second top surface lower than the first top surface; and
forming a second dielectric layer on the first dielectric layer, wherein the second dielectric layer comprises a first portion over the first top surface of the first dielectric layer and a second portion over the second top surface of the first dielectric layer, and top surfaces of the first portion and the second portion of the second dielectric layer are substantially level with each other.

19. The method of claim 18, wherein forming the first metal layer and the first dummy metal feature comprises:
forming a first opening and a second opening in the first portion and the second portion of the second dielectric layer to expose the first dielectric layer, respectively;
forming a via hole in the first dielectric layer and underlying the second opening; and forming a conductive material in the first opening, the second opening and the via hole to constitute the first dummy metal feature, the first metal feature and the via plug.

20. The method of claim 15, wherein the second die comprises a second bonding structure, the second bonding structure comprises a second dielectric structure disposed on a second pad; and a second metal layer and a second dummy metal feature are formed in the second dielectric structure, wherein the hybrid bonding process comprises:

bonding the first dielectric structure to the second dielectric structure;

bonding the first metal layer to the second metal layer; and bonding the first dummy metal feature to the second dummy metal feature.

* * * * *